United States Patent [19]

Sanchez

[11] Patent Number: 5,583,067

[45] Date of Patent: Dec. 10, 1996

[54] INVERSE T-GATE SEMICONDUCTOR DEVICE WITH SELF-ALIGNED PUNCHTHROUGH STOPS AND METHOD OF FABRICATION

[75] Inventor: Julian J. Sanchez, Mesa, Ariz.

[73] Assignee: Intel Corporation, Santa Clara, Calif.

[21] Appl. No.: 603,151

[22] Filed: Feb. 16, 1996

Related U.S. Application Data

[60] Continuation of Ser. No. 368,334, Jan. 4, 1995, abandoned, which is a division of Ser. No. 7,569, Jan. 22, 1993, abandoned.

[51] Int. Cl.$^6$ .................................................. H01L 21/265
[52] U.S. Cl. ............................... 437/44; 437/405; 437/41
[58] Field of Search .......................... 437/40 R, 41 R, 437/44, 45, 56, 57, 58, 200, 913, 40 SU, 41 SN

[56] References Cited

U.S. PATENT DOCUMENTS

| | | |
|---|---|---|
| 4,949,136 | 8/1990 | Jain . |
| 4,984,042 | 1/1991 | Pfiester et al. . |
| 5,028,552 | 7/1991 | Ushiku ........................... 437/45 |
| 5,091,763 | 2/1992 | Sanchez . |
| 5,097,301 | 3/1992 | Sanchez . |
| 5,182,619 | 1/1993 | Pfiester ............................ 437/44 |
| 5,183,771 | 2/1993 | Mitsui et al. .................... 437/44 |
| 5,219,777 | 6/1993 | Kang ................................ 437/44 |
| 5,296,401 | 3/1994 | Mitsui et al. .................... 437/56 |
| 5,320,974 | 6/1994 | Hori et al. ....................... 437/44 |

OTHER PUBLICATIONS

Kang, et al., "New Transistor Structure Optimization for 0.25μm CMOS Technology" *VLSI Symposium Tech. Digest*, 1991 pp. 85–86.

Wang, P. "Double Boron Implant Short–Channel MOSFET" *IEEE Transactions on Electrical Devices*, Mar. 1977, pp. 196–204.

Hori, et al., "A New Half–Micron p–Channel MOSFET with LATIPS (Large–Tilt–Angle–Implanted–Punch-through–Stopper)", *IEDM*, 1988, pp. 394–397.

Barnes, et al., "Short–Channel MOSFET's in the Punchthrough Current Mode", *IEEE Transactions on Elec.tron Devices*, Apr. 1979, pp. 446–452.

Sanchez, et al., "Hot–Electron Resistant Device Processing and Design: A Review", *IEEE Transactions on Semiconductor Mfg.* Feb. 1989, pp. 1–8.

Pfiester, et al. "A Self–Aligned LDD/Channel Implanted ITLDD Process with Selectively–Deposited Poly Gates for CMOS VLSI", *IEDM* 1989, pp. 769–772.

Izawa, et al., "The Impact of Gate–Drain Overlapped LDD (Gold) for Deep Submicron VLSIs", *IEEE*, 1987, pp. 38–41

(List continued on next page.)

*Primary Examiner*—Kevin Picardat
*Attorney, Agent, or Firm*—Blakely, Sokoloff, Taylor & Zafman

[57] ABSTRACT

A high speed submicron metal-oxide-semiconductor transistor which exhibits a high immunity to hot electron degradation, good performance, and excellent punchthrough characteristics. An inverse T gate comprising an upper member and a lower member is formed on a well of a first conductivity type. A gate insulating layer is formed between the composite gate and the well. A pair of first conductivity type punchthrough stop regions are formed apart in the well in alignment with the laterally opposite sides of the upper gate member. A first oxide sidewall spacer is formed adjacent to laterally opposite sidewalls of the upper gate member on the lower gate member. A first pair of source/drain regions of a second conductivity type are formed in alignment with the first oxide sidewall spacers. A second sidewall spacer is formed adjacent to each of the first sidewall spacers on the lower gate member. A second source and second drain region of the second conductivity type are formed in the first source and first drain regions, respectively. The second source and second drain regions are formed in alignment with the outer edges of the second sidewall spacers.

17 Claims, 8 Drawing Sheets

OTHER PUBLICATIONS

Chen, et al., "Simple Gate-to-Drain Overlapped MOSFET's Using Poly Spacers for High Immunity to Channel Hot-Electron Degradation", *IEEE Electron Device Letters,* vol. II, No. 2, Feb. 1990, pp. 78–81.

Huang, et al., "A Novel Submicron LDD Transistor with Inverse-T Gate Structure", *IEDM*, 1986, pp. 742–745.

Sanchez, et al., "Drain-Engineered Hot-Electron-Resistant Device Structures: A Review", *IEEE Transactions on Electron. Devices* vol. 36 No. 6, Jun. 1989, pp. 1125–1132.

Davari, et al., "Submicron Tungsten Gate MOSFET with 10nm Gate Oxide", *IEEE,* 1990, pp. 61–62.

INVERSE T-GATE SEMICONDUCTOR DEVICE WITH SELF-ALIGNED PUNCHTHROUGH STOPS AND METHOD OF FABRICATION

This is a continuation of application Ser. No. 08/368,334, filed Jan. 4, 1995, now abandoned, which is a divisional of application Ser. No. 08/007,569, filed Jan. 22, 1993 now abandoned.

BACKGROUND OF THE INVENTION

1. Field of the Invention

This invention relates to the field of semiconductor devices, and more specifically, to a metal oxide semiconductor field effect transistor (MOSFET) which exhibits excellent punchthrough characteristics, and which can be realized with a VLSI manufacturable process.

2. Discussion of Related Art

In order to fabricate future complex integrated circuits, the basic building block of integrated circuits, the transistor, must become smaller. Smaller metal oxide semiconductor (MOS) transistors are formed by decreasing the channel length of the transistor. Future MOS transistors will have channel lengths of less than 0.5 µm. A problem with manufacturing such small channel devices is that the punchthrough voltage of these transistors decreases to an unacceptable level.

The punchthrough voltage of a device is the drain voltage which causes the drain depletion region of the device to extend into the source depletion region. When this occurs the transistor conducts regardless of the gate voltage. This eliminates the ability of the transistor to act as a switch, i.e. to switch "on" and "off". MOS transistors of less than 1 µm cannot be fabricated without adjusting to some degree the process recipe to raise the punchthrough voltage of the device.

Presently there are two techniques for adjusting the punchthrough voltage of short channel MOSFET transistors. The first technique, as shown in FIG. 1, employs a double-boron implant of a P type substrate to form an N channel enhancement mode MOSFET. The first boron implant, a threshold implant 12, is a shallow implant of the channel region of the device. The threshold implant raises the threshold voltage of the transistor and prevents surface punchthrough. The second boron implant, the channel implant 14, is a deeper implant of the entire channel region of the transistor. The channel implant prevents bulk punchthrough of the device.

The double-boron implant transistor is undesired because the deep channel implant 14 adversely affects the performance characteristics of the transistor. The deep channel implant 14 is especially troublesome because it raises the doping at the depletion edge of the device, which affects the device's substrate sensitivity. Additionally, the channel implant adversely affects the sub-threshold slope (gate swing voltage) of the device and also affects threshold voltage.

The second punchthrough voltage adjusting technique is known as LATIPS, and is shown in FIG. 2. The LATIPS transistor employs a large tilt-angle implanted punchthrough stopper (LATIPS). This implant forms higher concentration P type regions 16 under the gate to prevent bulk punchthrough. This implant is generated by tilting and rotating the wafer as the implant occurs. The LATIPS transistor may also employ a threshold implant 18 to raise the threshold voltage and to prevent surface punchthrough.

The LATIPS transistor exhibits several undesirable features. First, the P implants 16 do not surround the entire drain. This requires wells to be deeper to prevent punchthrough leading to a reduction in packing densities. Second, the LATIPS technology has not been characterized extensively, making its successful use in the manufacturing environment questionable. This is because the rotational aspect of the punchthrough implant provides a doping uniformity which is dependent on the placement, shape, and layout of the fabricated transistor. Additionally, the LATIPS technique requires very specialized and expensive equipment which is difficult to obtain.

Thus, what is needed is a reliable submicron transistor which exhibits excellent punchthrough characteristics without sacrificing other device performance characteristics and which can be fabricated with a VLSI manufacturable process.

SUMMARY OF THE INVENTION

The preferred embodiment of the present invention is a composite inverse T GOLD metal oxide semiconductor transistor with self-aligned punchthrough stops. The transistor is fabricated in a P type well of a first concentration. A gate oxide layer is formed on the P type well. A tungsten lower gate member of a first length and width is formed on the gate insulating layer. A polysilicon upper gate member of a second length and same width is formed on the tungsten lower gate member wherein the second length is less than the first length. The upper gate member includes laterally opposite sidewalls along the width of the upper gate member. A first and a second punchthrough stop region of a second concentration of P type conductivity are disposed apart in the substrate in alignment with the opposite sidewalls of the polysilicon upper gate member, respectively. The second concentration of P type conductivity is greater than the first concentration of P type conductivity. First sidewalls spacers are formed on opposite sides of the laterally opposite sidewalls of the upper gate member. The first sidewall spacers are formed on the lower gate member. A first source region and a first drain region of a first concentration of N type conductivity are disposed in the first and second punchthrough stop regions, respectively, in alignment with the outer edges of the first sidewall spacers. A second sidewall spacer is formed adjacent to the outside edge of each of the first sidewall spacers on the lower gate member. A second source region and a second drain region of a second concentration of N type conductivity, wherein the second concentration is greater than the first concentration, are formed in the first source and first drain regions, respectively. The second source and second drain regions are formed in alignment with the outside edges of the second sidewall spacers. A threshold implant region of a third concentration of P type conductivity is formed near the surface of the substrate in the channel region of the transistor. Silicide is formed on the upper gate member and on the second source and second drain regions to reduce the contact resistance of the device.

A goal of the present invention is to form a reliable, high speed, submicron, MOS transistor which exhibits excellent punchthrough characteristics.

Another goal of the present invention is to provide a VLSI manufacturable process to form a reliable, high speed, submicron, MOS transistor with excellent punchthrough characteristics.

Still another goal of the present invention is to provide a high speed, reliable, submicron, transistor which exhibits excellent resistance to hot electron degradation.

BRIEF DESCRIPTION OF THE DRAWINGS

FIG. 4b is a cross-sectional illustration of the formation of an upper gate and P-type punchthrough stop regions in the well of FIG. 4a.

DETAILED DESCRIPTION OF THE PRESENT INVENTION

Figure 1:
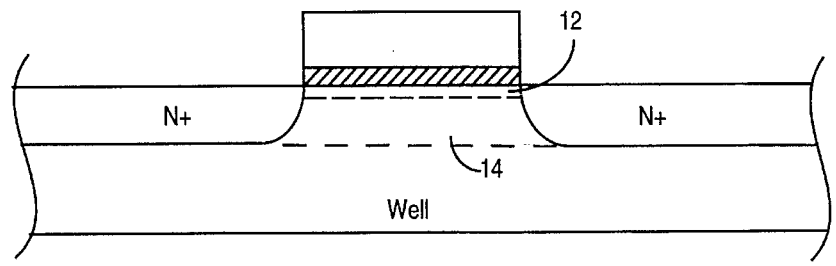
FIG. 1 is a prior art double boron implant short channel MOSFET.
Figure 2:
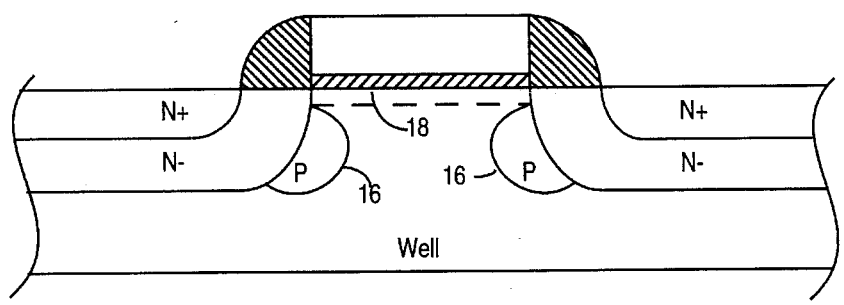
FIG. 2 is a prior art transistor with a large tilt-angle implanted punchthrough stopper (LATIPS).

The present invention discloses a novel, high speed, submicron, reliable, metal-oxide-semiconductor transistor which exhibits resistance to hot electron degradation without decreasing device performance and which exhibits excellent punchthrough characteristics. In the following description, numerous specific details are set forth in order to provide a thorough understanding of the present invention. However, it will be obvious to one skilled in the art that the present invention may be practiced without these specific details. In other instances, well-known metal-oxide-semiconductor (MOS) transistor concepts and fabrication techniques have not been set forth in detail in order to not unnecessarily obscure the present invention.

The currently preferred embodiment of the present invention is a high speed submicron metal-oxide-semiconductor (MOS) transistor which exhibits resistance to hot electron degradation without degrading device performance and which exhibits excellent punchthrough characteristics. Additionally, the transistor of the present invention can be fabricated in a VLSI manufacturing environment.

The present invention realizes a transistor which can be used in the latest high density VLSI circuits. The latest VLSI circuits attempt to pack transistors in higher and higher densities. It is, therefore, extremely advantageous to decrease the dimensions of the metal-oxide-semiconductor field-effect transistor in order to increase the transistor density of VLSI circuits. Present MOS transistors have channel lengths on the order of one micron (1 μm). The present invention is a MOS transistor which shows good reliability and performance while having a channel length of less than 0.25 μm and operating at 5 v. The difficulty with producing such small channel transistors is that the electric field, for a given voltage, increases as the channel length decreases. It is well-known that high electric fields near the drain induce hot electrons into the gate. In order to reduce the hot electron injection, the peak electric field of the device must be decreased. The peak electric field, however, must be decreased without significantly reducing device performance. Another problem with producing such small transistors is that the punchthrough voltage of the transistor must be altered (increased) in order to form a reliable transistor.

It is to be noted that "N+" and "N−" are used throughout the present disclosure. The short hand notation specifies the electron concentration of various regions of a metal-oxide-semiconductor device. For instance, "N−" specifies a region of light electron concentration (around $1 \times 10^{18}/cm^3$) while "N+" specifies a region of high electron concentration ($>1 \times 10^{19}/cm^3$). It is also to be noted that "gate length" is used in the normal convention and is used in the present invention to refer to the size of the lower gate member. The "channel length" is used to refer to the distance between the source and drain regions.

Figure 3:
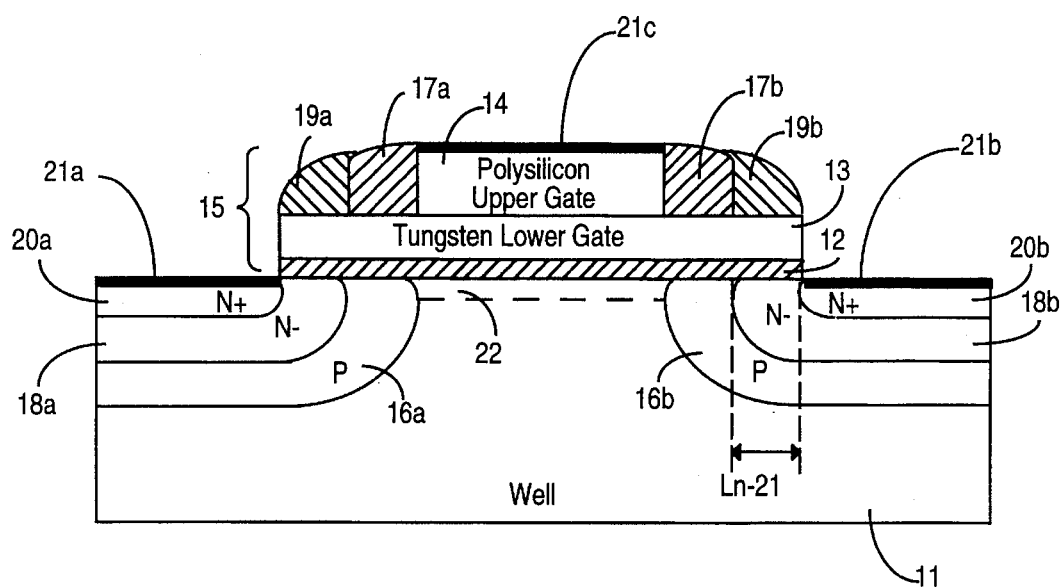
FIG. 3 is a cross sectional view of a composite inverse T GOLD with self-aligned punchthrough stops of the present invention.

The presently preferred embodiment of the present invention is shown in FIG. 3. The preferred embodiment of the present invention is a composite inverse T gate overlapped lightly doped drain (GOLD) transistor with self aligned punchthrough stop regions. The device is formed in a P type substrate or well 11 which provides the channel region for the N channel MOSFET. A gate oxide layer 12 is formed on the P type well. A tungsten lower gate member 13 is formed on the gate oxide layer 12. An N+ polysilicon upper gate member 14 is formed on the tungsten lower gate member 13. The polysilicon upper gate member 14 has a length less than the tungsten lower gate member 13 thereby giving the whole gate or composite gate an "inverse T" configuration 15. Punchthrough stop regions of a P type conductivity 16a and 16b are disposed in the P type well 11 in alignment with the outer edges of the polysilicon upper gate member 14. A first pair of sidewall spacers 17a and 17b are formed adjacent to each side of the polysilicon upper gate member 14 on the tungsten lower gate member 13. First source/drain regions 18a and 18b of an N− conductivity are formed in the P punchthrough stop regions 16a and 16b, respectively, in alignment with the outer edges of the first pair of sidewall spacers 17a and 17b. A second pair of sidewall spacers 19a and 19b are formed adjacent to the outer edges of the first pair of sidewall spacers 17a and 17b on the tungsten lower gate member. Second source/drain regions 20a and 20b of N+ conductivity are formed in the first source/drain region 18a and 18b, respectively, in alignment with the outside edges of the second pair of sidewall spacers 19a and 19b. Additionally, silicide 21a, 21b, and 21c can be formed on the source/drain regions 20a and 20b and on the upper gate member 14 to reduce the contact resistance of the device.

The present invention utilizes two punchthrough stops regions 16a and 16b. The punchthrough stop regions 16a and 16b raise the punchthrough voltage of the transistor. The punchthrough stop regions 16a and 16b allow reliable small-scale transistors to be fabricated. Additionally, the punchthrough stop regions 16a and 16b allow a lower doped substrate to be utilized which can drastically improve the speed of the fabricated transistor. The punchthrough stop regions 16a and 16b are formed deeper into the P type substrate than the N– source/drain regions and completely surround the source and drain regions of the transistor. Additionally, a threshold implant is provided to prevent surface punchthrough and to raise the threshold voltage of the transistor.

The present invention, by utilizing two source/drain regions 18 and 20, creates a lightly doped drain (LDD) structure which makes the transistor resistant to hot electron degradation. The LDD structure increases the device's reliability by decreasing the peak electric field. The LDD structure uses lower doping for the drain, grading of the drain, and gate overlap to reduce the electric field. The N– lightly doped source/drain regions 18a and 18b provide a lightly doped drain region for the transistor. The N+ source/drain regions 20a and 20b provide ohmic contacts for the transistor. The double source/drain structure reduces the peak electric field for a given voltage by spreading the drain voltage drop over a wider depletion area. The reduction in drive capability of the device, normally associated with LDD devices, is significantly reduced due to the gate to N– overlap provided by regions 18a and 18b.

It should be noted that the N– regions 18a and 18b are formed at higher implant energies into the well than the N+ regions 20a and 20b thereby giving the transistor a sloped junction. A sloped junction helps to reduce the hot electron injection into the gate by drawing the current away from the surface and separating the maximum current density from the maximum field.

The present invention places the lower gate member 13 over the N-lightly doped drain regions to form a gate to drain overlap (GOLD) structure. The overlap is shown as Ln–21 in FIG. 3. The overlap structure increases the reliability and the performance of the transistor by positioning the peak electric field underneath the gate. Locating the peak electric field underneath the gate increases the lifetime of the device by minimizing the voltage drop between the drain and the channel when the gate voltage is high thereby reducing the lateral field. Also, locating the peak electric field underneath the gate minimizes the ability of localized charges to raise the resistance of the channel at the drain end of the device and thereby decrease the transistors performance. With the gate overlap of the drain a lower N– doping can be used than in the traditional LDD structures thereby allowing further reductions in the lateral field. In other words, reductions in drive capability caused by the lower doped drain can be minimized by locating the peak electric field underneath the gate. The drain-to-gate overlap region Ln–, however, increases the drain/gate capacitance of the device by about 20%, however, this is offset by the shorter channel lengths made possible.

A composite inverse T gate 15 is used in the present invention. The composite inverse T gate provides a manufacturable process for forming the gate overlap of the drain and the punchthrough stop regions. The composite inverse TLDD structure allows the punchthrough stop regions 16a and 16b to be self-aligned to the upper gate member, the N– LDD regions 18a and 18b to be self-aligned to the first pair of sidewalls spacers and the N+ source/drain regions 20a and 20b to be self aligned to the outside edge of the lower gate member. The self alignment process removes the possibility of operator misalignment which can result in an undesired offsets. The self alignment process helps to guarantee uniformity of device structure across a wafer.

The preferred embodiment of the present invention utilizes a composite inverse T gate. In the preferred embodiment of the present invention the lower gate of the composite gate is tungsten and the upper gate is polysilicon. The composite gate provides both process and performance improvements over traditional ITLDD devices. The process is improved because the tungsten lower gate provides an etch stop for the polysilicon upper gate patterning. The performance is improved because the composite gate provides the benefits of both polysilicon gates and tungsten gates. The polysilicon upper gate member getters moisture and hydrogen, retaining the hot electron resistant properties of traditional polysilicon gates.

The tungsten lower gate member 13 of the present invention improves the device's performance in a number of ways. Tungsten's low gate resistance (10 $\mu\Omega$-cm) helps to offset the negative effects caused by the increased gate/drain capacitance from the gate overlap of the drain. Tungsten is also better than N+ doped polysilicon for submicron gates because of its near-mid gap work function is approximately equal to 4.8 electron volts. Tungsten gates have a 20% higher saturation transconductance (Gm) and a 35% increase in mobility than polysilicon gate devices. The higher work function also increases the punchthrough voltage. These factors increase both the speed and performance of the device. The composite gate both improves the device's performance and the manufacturability of the process.

Figure 4A:
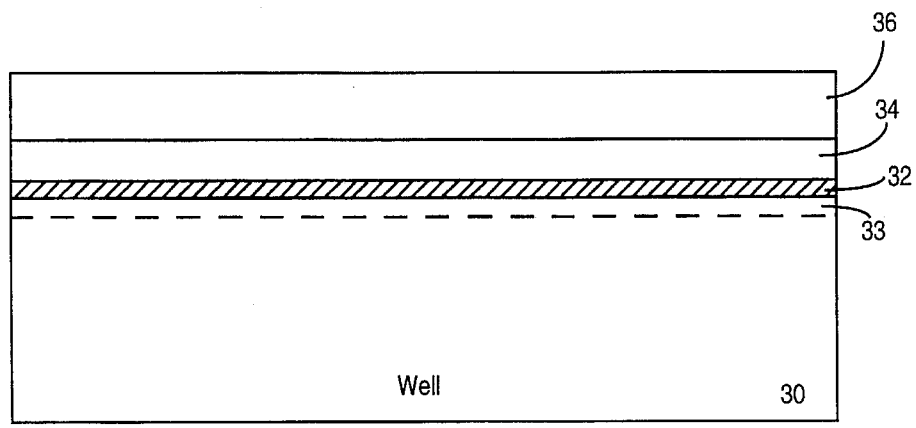
FIG. 4a is a cross-sectional illustration of a P type silicon substrate or well with a threshold implant in the upper surface, a gate insulating layer formed on the P type well, and a tungsten layer formed upon the gate insulating layer and a N+ polysilicon layer formed on the tungsten layer.

In fabrication of the invented submicron metal-oxide-semiconductor transistor with the presently preferred process, a P type silicon substrate or well 30 shown in FIG. 4a is used. The well 30 is doped with boron atoms to a level of 10 to 15 ohms-cm (i.e. to a concentration of about $10^{15}/cm^3$). A relatively low doped well can be used because the punchthrough voltage is adjusted by a threshold implant and a bulk punchthrough implant. A low doped well translates into faster switching speeds for the device. (Normally higher doped wells are used to help improve (raise) a device's punchthrough voltage.) An approximately 150Å thick gate oxide layer 32 is grown over the P type well. The gate oxide layer 32 is grown in a diffusion furnace at approximately 920° C. at atmosphere for 40 minutes in 97% $O_2$ and 3% TCA.

Next, a threshold implant region 33 is formed by implanting P type impurities through the gate oxide layer 32 into the surface of the P type well. In the preferred embodiment the threshold implant 33 is formed by implanting boron atoms at a dose of approximately $5\times10^{12}/cm^2$ and an energy of approximately 30 kev into the P type well 30. The threshold implant brings the concentration of P type impurities near the surface of the well to approximately $1\times10^{17}/cm^3$. Next, a 1000Å thick tungsten layer 34 is sputtered on the gate oxide layer 32. The tungsten layer 34 is sputtered from a tungsten target at a pressure of approximately 55 mtorr and a power of approximately 6 kw in Argon. A 2,500Å thick polysilicon layer 36 is then deposited on the tungsten layer. The polysilicon layer 36 is formed by LPCVD in $SiH_4$ at a pressure of 130–190 mtorr and a temperature of 615° C. The polysilicon layer is then doped to an N+ conductivity with a dose of $1\times10^{15}/cm^2$ N type impurities in an ion implanter at an energy of 30 kev.

Figure 4B:
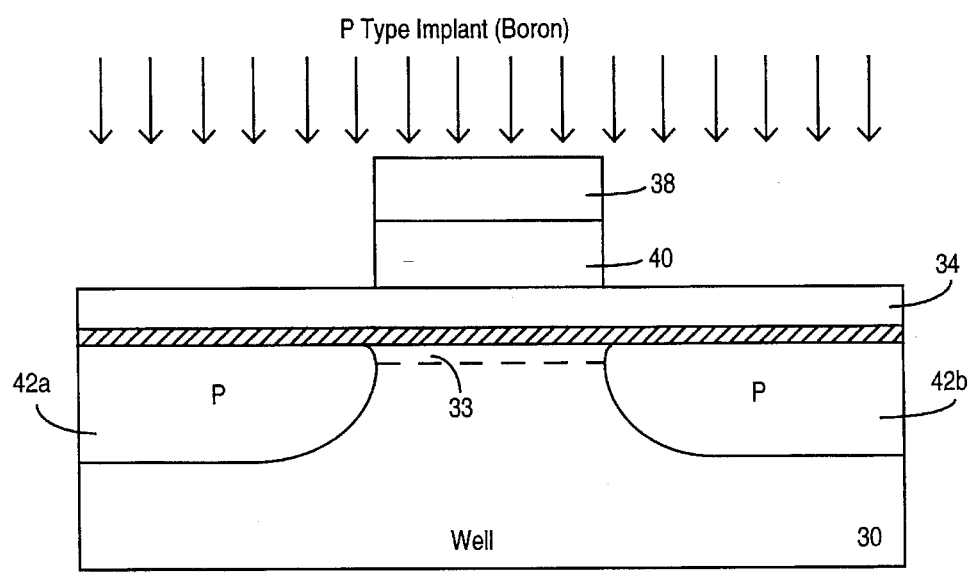

Referring to FIG. 4b, a photoresist layer 38 is deposited, masked, exposed, and developed defining the length and location where the polysilicon upper gate member 40 will be formed. The entire polysilicon layer 36 is etched away except for the area masked by the photoresist 38. An etchant is chosen which is more selective to polysilicon than to tungsten. In this way when an area of the device reaches the tungsten layer 34 it will essentially stop etching while another area of the device not yet through the polysilicon layer will continue to etch the polysilicon until the tungsten layer 34 is reached. In the preferred embodiment a reactive ion etch (RIE) with $CF_4/O_2$ at a power of approximately 250 watts and a pressure of 2 torr may be used. The completion of the polysilicon etch is end point detected by analyzing the residual gas exhausted during the etch. The ability to endpoint detect the completion of polysilicon etch makes the present invention VLSI manufacturable. Each device on a wafer and each wafer from run to run will therefore have substantially the same uniform tungsten lower gate electrode 34 after etching the polysilicon layer 36.

In reference to FIG. 4b, P type punchthrough stop regions 42a and 42b are formed. A P type implant of boron atoms with a doping dose on the order of $1\times10^{13}/cm^2$ and an energy of between 60 kev and 120 kev is made through the gate oxide and tungsten layers to form the punchthrough stop regions 42a and 42b. This forms punchthrough stop regions 42a and 42b with a hole concentrations of approximately $1\times10^{17}/cm^3$. All the devices located in the P-well are subjected to the punchthrough implant. The polysilicon upper gate member 40 and the photoresist layer 38 act as a mask to prevent the entire channel region in the P type substrate from becoming doped to a higher P type concentration. In this way, the punchthrough stop regions 42a and 42b are self-aligned to laterally opposite outside edges of the upper gate member 40. This technique ensures that the punchthrough stop regions 42a and 42b are placed precisely where desired without worrying about mask alignment tolerances. Although the punchthrough stop regions are formed in alignment with the polysilicon upper gate member 40, some of the boron atoms during later process steps may laterally diffuse further into the channel region of the device. This is minimized, however, by the use of lower temperatures and shorter process times in the remainder of the process. It is to be appreciated that the P type punchthrough implant is formed with standard well-known processing technology where boron atoms are implanted at 90° angles to the silicon substrate. The standard implant forms punchthrough stop regions 42a and 42b which are uniformly doped across the surface of the wafer and which are uniform from wafer to wafer, making the present invention extremely VLSI manufacturable. No specialized or uncharacterized machinery is required in the present invention.

Figure 4C:
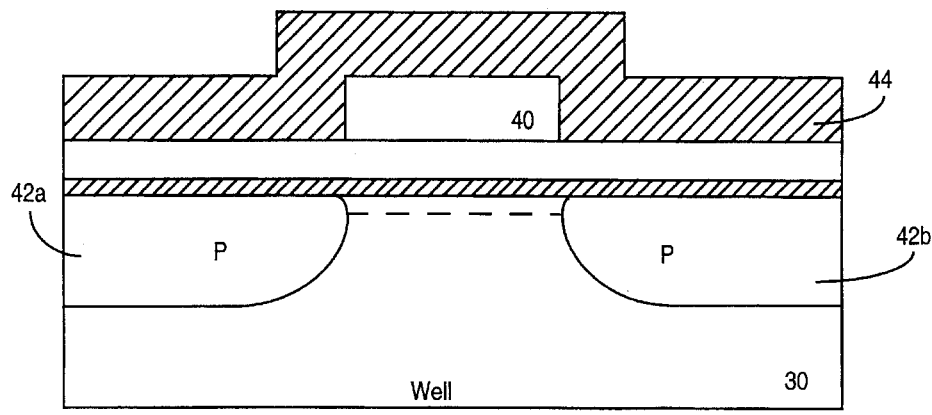
FIG. 4c is a cross-sectional illustration of the formation of a conformal layer of oxide on the device of FIG. 4b.

In reference to FIG. 4c, a first pair of spacers are formed. First the photoresist mask 38 is removed with well-known techniques. Next, an approximately 2500Å conformal layer 44 of oxide or silicon-nitride is formed over the device. If an oxide layer is used, it is formed by a low temperature process with 60% $O_2$, 11% $SiH_4$, and 29% DPI (which is approximately 15% phosphine and 85% silane) at a temperature of approximately 400° C. If a silicon-nitride layer is used, it is formed by chemical vapor deposition with $SiH_2Cl_2$ and 10 $NH_3$.

Figure 4D:
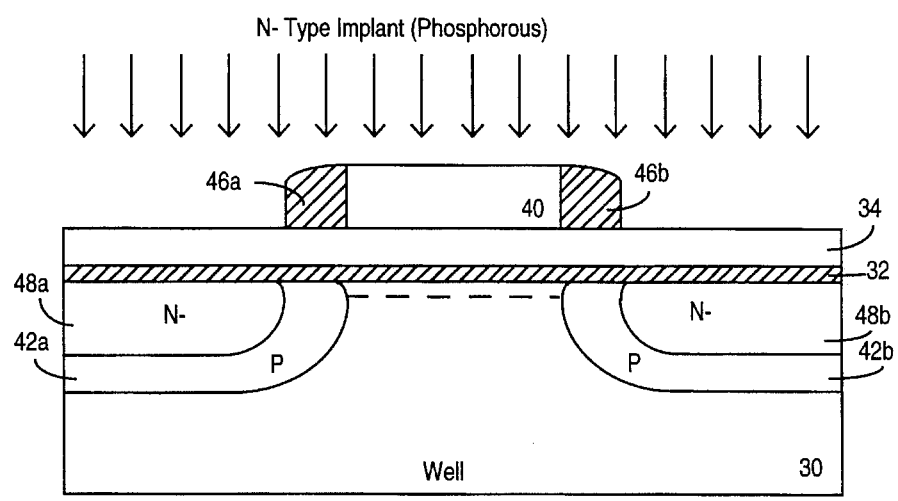
FIG. 4d is a cross-sectional illustration of the formation of a first pair of sidewall spacers and the formation of a pair of N− source/drain regions in the well of FIG. 4c.

Next, as shown in FIG. 4d the first conformal spacer layer 44 is anisotropically etched to form sidewall spacers 46a and 46b on each side of the polysilicon upper gate member 40. A conformal layer 44 is required in order to fabricate spacers which have uniform and precisely controlled thicknesses across a wafer. If an oxide layer is utilized it is reactive ion etched with $CHF_3$ and $C_2F_6$. If a silicon-nitride layer is used it is reactive ion etched with $C_2F_6$.

After the formation of sidewall spacers 46a and 46b first source/drain regions 48a and 48b of N− conductivity are formed in the P type punchthrough stop regions 42a and 42b, respectively. The N− source/drain regions are formed by implanting phosphorous atoms with a dose on the order of $5\times10^{13}/cm^2$ at an energy of approximately 50 kev through the gate oxide layer 32 and the tungsten lower gate layer 34. The upper gate member 40 and the first pair of spacers 46a and 46b prevent the channel region of the device from becoming N− doped. The N− source/drain regions are formed in alignment with the outside edges of the first pair of spacers 46a and 46b. The N− source/drain regions 48a and 48b are completely surrounded by the punchthrough stop regions 42a and 42b.

Figure 4E:
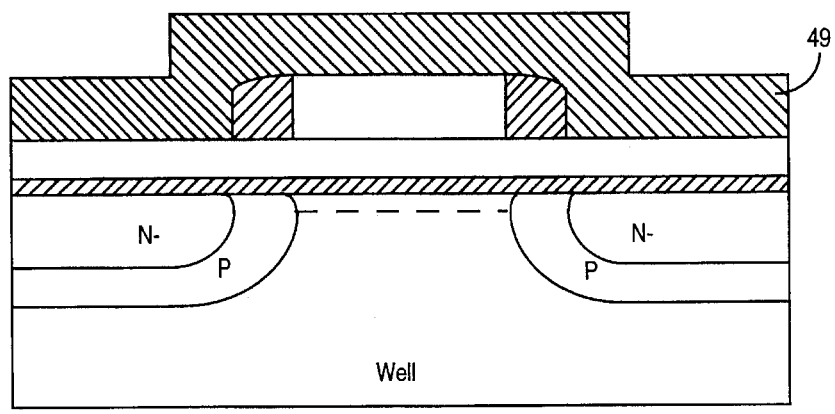
FIG. 4e is a cross-sectional illustration of the formation of a conformal layer of silicon-nitride on the device of FIG. 4d.
Figure 4F:
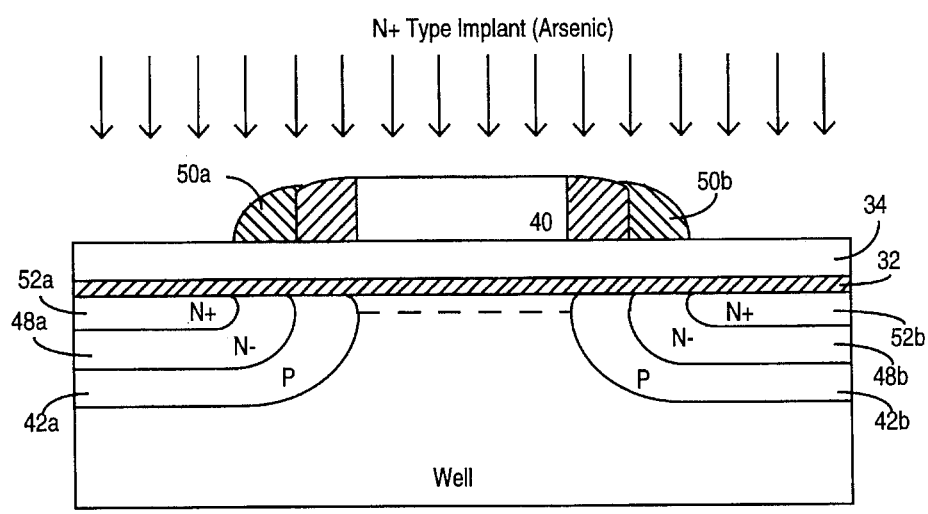
FIG. 4f is a cross-sectional illustration of the formation of a second pair of sidewall spacers and the formation of a pair of N+ source/drain regions in the well of FIG. 4e.

Next, a second pair of spacers are formed. First, as shown in FIG. 4e, an approximately 2000Å, conformal layer 49 of oxide or silicon-nitride is formed over the entire device structure. In the preferred embodiment of the present invention, the layer is formed from a material different than that which was used for the first pair of spacers (i.e. if the first pair of spacers is formed from an oxide layer, then the second pair of spacers is formed from a nitride layer, or if the first pair is formed from a nitride layer, then the second pair is formed from an oxide layer). Next, as shown in FIG. 4f, the second conformal layer 49 is anisotropically etched to form a second pair of sidewall spacers 50a and 50b. The second pair of spacers 50a and 50b act as a mask for the implant of N+ source/drain regions 52a and 52b. In the preferred embodiment of the present invention, the N+ regions are formed by implanting arsenic atoms at a dose of approximately $1\times10^{15}/cm^2$ at an energy of approximately 40 kev through the tungsten and oxide layers into the N− source/drain regions. This provides N+ source/drain regions of approximately $1\times10^{20}/cm^3$ doping concentration. The N+ source/drain regions 52a and 52b are self-aligned to the outside edges of the second pair of sidewall spacers.

Figure 4G:
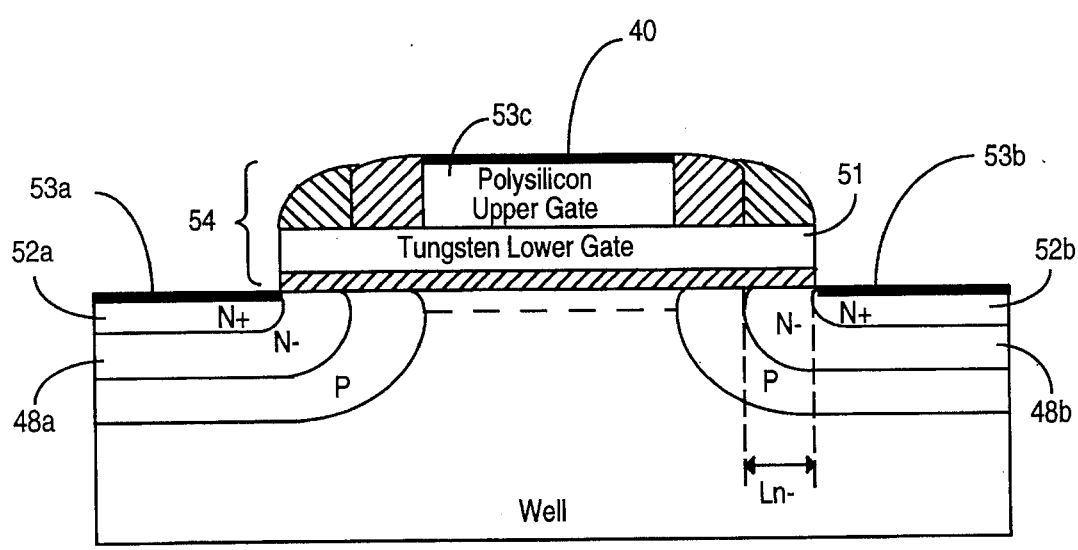
FIG. 4g is a cross-sectional illustration of the formation of a lower gate member and the formation of silicide on the upper gate member and on the N+ source/drain regions in the well of FIG. 4f.

Next the lower gate member 53 is formed, as shown in FIG. 4g. This is accomplished by etching off the tungsten and oxide layers over the N+ source/drain regions 52a and 52b. The tungsten layer is etched in $CF_4/O_2$ at a power of approximately 250 watts and a pressure of approximately 2 torr. The first and second pair of spacers as well as the polysilicon upper gate member 40 act as a mask for the tungsten lower gate definition etch. In this way the tungsten lower gate member 53 is self-aligned to the N+ source/drain regions 52a and 52b and overlaps the N− source/drain region 48a and 48b a distance (Ln−) approximately equal to the length of the second sidewall spacers. In this way, the MOSFET of the present invention has a GOLD structure to help reduce the transistor's hot electron degradation and improve its performance. As is readily apparent in FIG. 4g, the transistor of the present invention has a composite gate electrode 54 comprising a polysilicon upper gate member 40 and a larger tungsten lower gate member 51. This gives the gate electrode 54 of the MOSFET of the present invention an inverse "T" configuration.

It is to be appreciated that the GOLD MOSFET of the present invention may now be completed by removing the gate oxide layer which exists over the N+ source/drain regions. The oxide is removed by etching $CF_4/CHF_3$ at a power of approximately 1000 watts and at a pressure of approximately 3.2 torrs for 20 seconds. At this time other well-known process steps are used to complete the fabrication of the MOSFET. An interlayer dielectric is deposited to separate the gate from the metal layer to follow. Metal contacts are fabricated next to electrically couple the device to other elements in the circuit. A protective glass or passivation is formed over the device to protect the device from contamination or electrical shorts.

Additionally, as shown in FIG. 4g, silicide can be formed on the polysilicon upper gate member 40 and on the N+ source/drain regions 52a and 52b to improve the contact resistance of the device. Silicide can dramatically improve the performance of the fabricated transistor. Titanium at a thickness of approximately 600Å is sputtered in argon at a pressure of approximately 2 mtorr and a power of approximately 6 kwatts over the entire structure. Next the substrate is annealed in $N_2$ at a temperature of approximately 725° C. to form titanium silicide in those areas where silicon and titanium can react. Then, as shown in FIG. 4g, the device is wet-etched, thereby selectively removing the unreacted titanium deposited over the first and second sidewall spacers and leaving titanium silicide 53c, 53a, and 53b on the gate, source, and drain of the transistor, respectively. The silicide process decreases the resistivity of the N+ source/drain regions from 20 ohms per square to approximately 4 ohms per square. If desired, the sidewall spacers can now be removed with a wet-etch.

Figure 5:
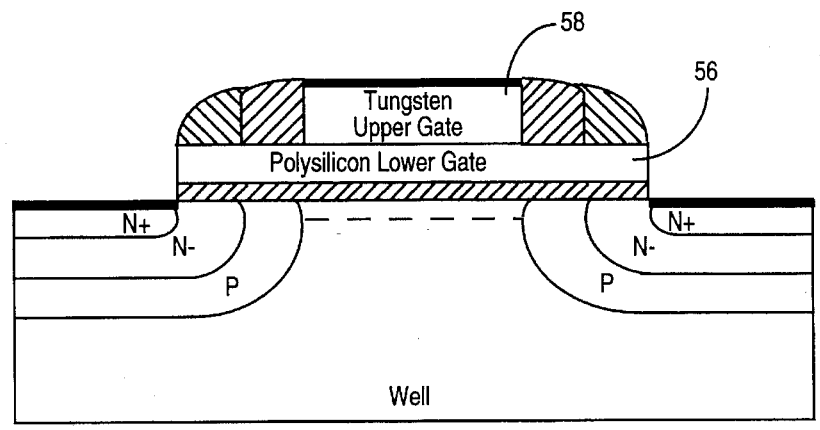
FIG. 5 is a cross-sectional illustration of a composite inverse T GOLD MOS transistor with self-aligned punchthrough stop regions with a tungsten upper gate and a polysilicon lower gate.

In reference to FIG. 5, an alternative embodiment of the inverse T GOLD MOSFET with self-aligned punchthrough stop regions of the present invention is shown. In this embodiment, the lower gate electrode 56 is polysilicon and the upper gate electrode 58 is tungsten. Because the upper gate electrode and the lower gate electrode are formed from different materials, the tungsten upper gate etch can be endpoint detected. This feature helps to make the fabrication process VLSI manufacturable.

Figure 6:
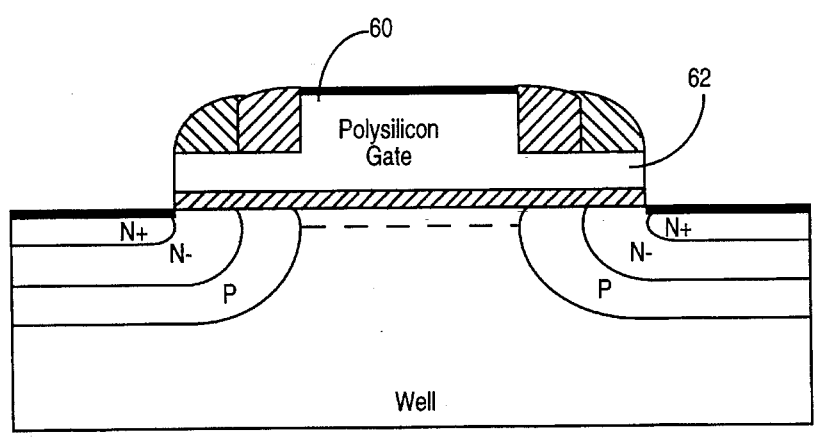
FIG. 6 is a cross-sectional illustration of an inverse T GOLD MOS transistor with self-aligned punchthrough stop regions and with a polysilicon upper gate and a polysilicon lower gate.

In reference to FIG. 6, another embodiment of the GOLD MOSFET transistor with self-aligned punchthrough stops of the present invention is shown. In this embodiment both the upper and lower gate members are formed from a single layer of polysilicon. It is to be appreciated that because both the upper and lower gates of the device are formed from the same material, a timed etch is necessary to define the upper gate member 60. This makes the process for this embodiment significantly less manufacturable than the other embodiments.

Figure 7:
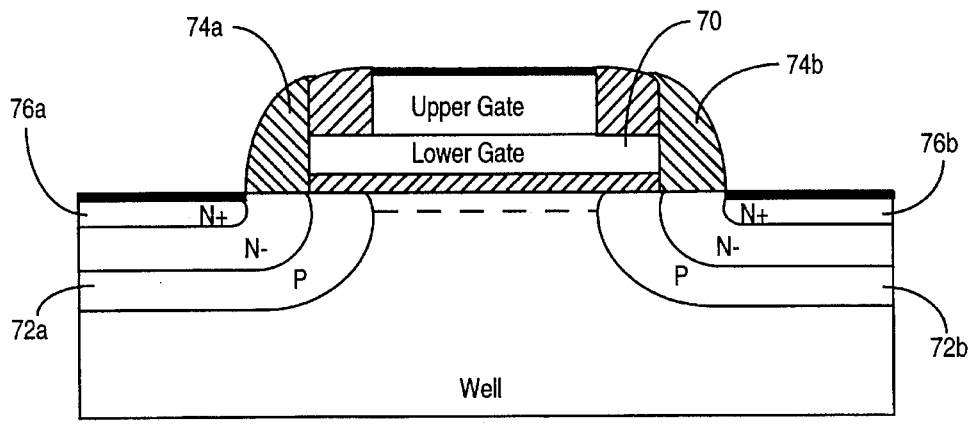
FIG. 7 is a cross-sectional illustration of an inverse T lightly doped drain (LDD) MOS transistor with self-aligned punchthrough stops.

It is to be appreciated that the teachings of the present invention can be used to fabricate a wide variety of MOS transistors with self-aligned punchthrough stops. For example, as shown in FIG. 7, an inverse T lightly doped drain (LDD) transistor with self-aligned punchthrough stops can be fabricated. In this embodiment the lower gate member is patterned (etched) after implanting the punchthrough stop regions 72a and 72b. The second sidewall spacers, 74a and 74b, are formed on the substrate with the second source/drain regions 76a and 76b disposed in alignment with the outside edges of the second sidewall spacers. The LDD device of FIG. 7 is resistant to hot electron degradation due to its lightly doped drain. However, because the lower gate member of the LDD device of FIG. 7 does not overlap the lightly doped drain region, its drive current and overall performance is significantly less than the inverse T GOLD device of FIG. 3.

Figure 8:
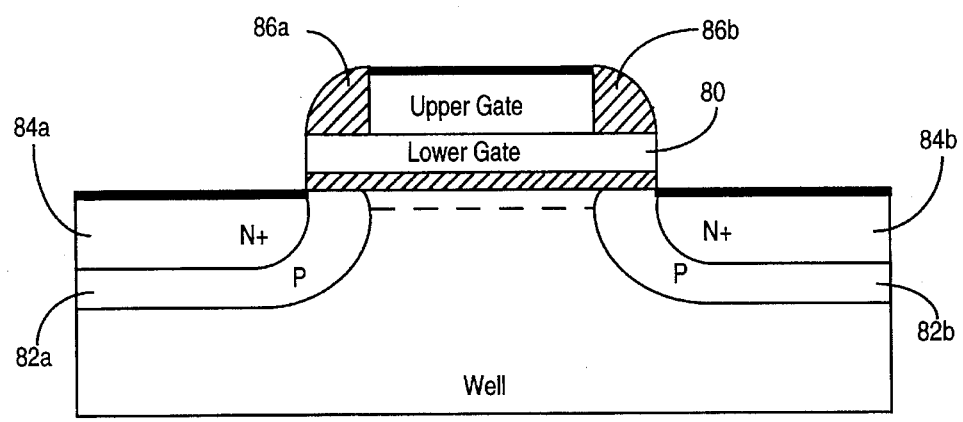
FIG. 8 is a cross-sectional illustration of an inverse T MOS transistor with self-aligned punchthrough stops.

Additionally, as shown in FIG. 8, a standard transistor with self-aligned punchthrough stops can be fabricated. In this embodiment, the lower gate member is patterned (etched) after the formation of the punchthrough stop regions 82a and 82b. Next N+ source/drain regions 84a and 84b are formed in alignment with the outside edges of the sidewall spacers 86a and 86b. It is noted that this transistor does not have a lightly doped drain structure so that when fabricated with small channel lengths it can be expected to experience hot electron problems.

It is also to be appreciated that although N channel transistors have been described in detail herein, the present invention may also be practiced as a P type channel transistor. In fabricating a P channel self-aligned punchthrough implant MOSFET, the doping conductivity's of the P channel device are simply opposite to those of the N channel device. The device is formed in an N type substrate or well with N type punchthrough stop regions, P−source/drain regions and P+source/drain regions formed respectively therein. Tungsten and/or polysilicon would be used to form the composite "inverse T" gate. Spacers would be utilized for alignment and masking steps.

Thus, a novel high speed, highly reliable, VLSI manufacturable MOSFET with self-aligned punchthrough stops has been described.

I claim:

1. A process for making a metal-oxide-semiconductor transistor on a well of a first concentration of a first conductivity type comprising the steps of:

forming a gate insulating layer on said well;

forming a first conductive layer on said insulating layer;

forming a second conductive layer on said first conductive layer;

forming an upper gate member of a first length from said second conductive layer, said upper gate member including laterally opposite sidewalls along the width of said upper gate member;

implanting ions of said first conductivity type through said first conductive layer into said well in alignment with said laterally opposite sidewalls of said upper gate member to form a first and a second punchthrough stop region;

forming a first sidewall spacer on opposite sides of said upper gate member on said first conductive layer; and forming a first source region and a first drain region of a first concentration of a second conductivity type in said first and second punchthrough stop regions, respectively, said first source and first drain regions formed in alignment with the outer edges of said first sidewall spacers.

2. The process for making a metal oxide semiconductor transistor of claim 1 further comprising the steps of:

forming a second sidewall spacer adjacent to each of said first sidewall spacers on said first conductive layer; and forming a second source and a second drain region of a second concentration of said second conductivity type, said second source and second drain regions formed in said first source and said first drain regions, respectively.

3. The process of claim 2 further comprising the step of forming silicide on said upper gate member and on said second source and second drain regions.

4. The process of claim 1 wherein said first conductivity type is P-type conductivity and said second conductivity is N type conductivity.

5. The process of claim 1 wherein said first conductive layer is tungsten.

6. The process of claim 1 wherein said second conductive layer is polysilicon.

7. The process of claim 5 wherein said second conductive layer is polysilicon.

8. The process of claim 1 wherein said first conductive layer is polysilicon.

9. The process of claim 8 wherein said second conductive layer is tungsten.

10. The process of claim 8 wherein said second conductive layer is polysilicon.

11. The process of claim 1 further comprising a step of making a threshold implant of first conductivity type ions into the upper surface of said well.

12. A method of forming a transistor on a substrate region of a first concentration of a first conductivity type, the method comprising the steps of:

forming a gate insulating layer on said substrate region;

forming a first conductive layer on said gate insulating layer;

forming a second conductive layer on said first conductive layer;

forming an upper gate member of a first length from said second conductive layer, said upper gate member including laterally opposite sidewalls along the width of said upper gate member;

implanting ions of said first conductivity type through said first conductive layer into said substrate in alignment with said laterally opposite sidewalls of said upper gate member to form a punchthrough stop region;

forming a first sidewall spacer on opposite sides of said upper gate member; and implanting ions into said substrate in alignment with said first sidewall spacer to form a first source and a first drain region of a first concentration of a second conductivity type.

13. The method of claim 12 further comprising the steps of:

forming a second sidewall spacer adjacent of each of said first sidewall spacers; and forming a second source and a second drain region of a second concentration of said second conductivity type.

14. The method of claim 12 further comprising a step of implanting ions of said first conductivity type ion into the upper surface of said substrate to form a threshold implant.

15. The process of claim 13 further comprising the step of forming silicide on the upper gate member and on said second source and second drain regions.

16. The method of claim 12 wherein said upper gate member comprises polysilicon.

17. The method of claim 12 wherein said bottom gate member comprises tungsten.

* * * * *